United States Patent [19]

Liberman et al.

[11] Patent Number: 5,670,914

[45] Date of Patent: Sep. 23, 1997

[54] MINIATURE ATOMIC FREQUENCY STANDARD

[75] Inventors: Irving Liberman, Pittsburgh; Peter J. Chantry, Churchill Boro, both of Pa.

[73] Assignee: Northrop Grumman Corporation, Los Angeles, Calif.

[21] Appl. No.: 533,301

[22] Filed: Sep. 25, 1995

[51] Int. Cl.$^6$ .................... H01S 1/00; H03L 7/26
[52] U.S. Cl. .................... 331/94.1; 331/3; 250/251
[58] Field of Search .................... 250/251, 389; 331/3, 94.1; 333/230; 368/118, 155, 156

[56] References Cited

U.S. PATENT DOCUMENTS

| | | | |
|---|---|---|---|
| 5,192,921 | 3/1993 | Chantry et al. | 331/3 |
| 5,327,105 | 7/1994 | Liberman et al. | 331/94.1 |
| 5,442,326 | 8/1995 | Liberman | 331/94 |
| 5,517,157 | 5/1996 | English | 331/94.1 |

FOREIGN PATENT DOCUMENTS

| | | | |
|---|---|---|---|
| 0561261 | 9/1993 | European Pat. Off. | |
| 2541047 | 8/1984 | France . | |
| 0019096 | 2/1977 | Japan | 331/94.1 |
| 55-72094 | 5/1980 | Japan . | |

OTHER PUBLICATIONS

Patent Abstracts of Japan, vol. 006, No. 115 (E–115), 26 Jun. 1982 and JP A, 57 043484 (Fujitsu Ltd), 11 Mar., 1982.
Patent Abstracts of Japan, vol. 009, No. 189 (E–333), 6 Aug. 1985 and JP,A,60 058688 (Nippon Denki KK), 4 Apr. 1985.
Patent Abstracts of Japan, vol. 004, No. 117 (E–022), 20 Aug. 1980 and JP,A,55 072094 (Seiko Epson Corp), 30 May 1980.

*Primary Examiner*—Robert Pascal
*Assistant Examiner*—Arnold Kinkead
*Attorney, Agent, or Firm*—Walter G. Sutcliff

[57] ABSTRACT

A miniature atomic frequency standard utilizes a tubular vapor cell extending transversely through a $TE_{210}$ microwave cavity. In one embodiment of the invention, the vapor cell is heated directly by electric heaters secured to ends of the tubular vapor cell which extend outside the microwave cavity. The vapor cell is insulated by thermal insulation inside the microwave cavity and between the microwave cavity and a magnetic shield. In another embodiment of the invention, the entire microwave cavity is heated which eliminates the need for thermal insulation inside the cavity and thus it can be made smaller, but additional thermal insulation is provided between the microwave cavity and the magnetic shield. Preferably, the C-field coil is wound on the thermal insulation just inside the magnetic shield to reduce heat loss by conduction. A laser diode outside the magnetic shield transmits light to the vapor cell through optic fiber without need for a collimating lens and a photodiode with an integral lens is used as the detector.

19 Claims, 3 Drawing Sheets

MINIATURE ATOMIC FREQUENCY STANDARD

This invention was made in the performance of the U.S. Government, Department of Defense, U.S. Air Force Contract No. F33615-94-C-1477.

BACKGROUND OF THE INVENTION

1. Field of the Invention

This invention relates to a miniature atomic frequency standard with reduced heating requirements and with an external light source.

2. Background Information

A known type of atomic frequency standard tunes a microwave oscillator to the hyper-fine wavelength of a vapor such as cesium or rubidium. A light beam passed through the vapor pumps the atoms from the ground state up to a higher state from which they fall to an intermediate state which is at the hyper-fine wavelength above the ground state. Absorption of the light in pumping the vapor atoms to a higher state is detected by a photo detector. When the ground state becomes depleted, the light passing through the detector increases. However, with the microwave signal tuned to the hyper-fine wavelength, the ground state is repopulated so that the light is continuously absorbed in pumping the vapor atoms. Thus, the response of the detector to the wavelength of the light exhibits a dip at the exact wavelength (the optical resonance wavelength) at which the vapor atoms are pumped to the higher state. The microwave frequency must also be at the precise hyper-fine frequency (microwave atomic transition frequency) to produce the maximum absorption of the light, and therefore the minimum photo detector signal. The microwave oscillator outputs a time standard signal of precise frequency proportional to the microwave atomic transition frequency.

Typically, the vapor is contained within an elongated tube or cell through which the light is transmitted longitudinally. A microwave resonator through which the tube or cell containing the vapor extends couples the microwave signal to the vapor. Conventionally, the light source is a gas discharge lamp containing the same vapor which is in the cell or tube. Lenses are used to collimate the light beam for injection into the tube or cell. Additional lenses at the other end of the tube or cell focus the light that is passed through the vapor onto a photo detector. Typically, the apparatus is enclosed by a magnetic shield. It is also common to provide a C field winding to separate the degenerate hyper-fine frequencies. It is also necessary to provide heat to stabilize the transition wavelengths and to provide adequate vapor pressure. Electric heaters are typically provided outside of the magnetic shield where the magnetic fields generated by the heat source do not influence the vapor transition wavelengths.

Such atomic frequency standards are bulky and expensive. U.S. Pat. No. 5,192,921 discloses a miniature atomic frequency standard which is greatly reduced in size, for instance, less than 12 cm$^3$ when cesium is used as the vapor. Cesium is preferred over rubidium as the dimensions of the microwave cavity are related to the wavelength and the wavelength for cesium is considerably shorter than that for rubidium. This patent suggests the use of a $TE_{10}$ cavity loaded with a low loss dielectric material which further reduces the required dimensions. As an alternative to a microwave cavity, the patent suggests a slow-wave helical exciter.

U.S. Pat. No. 5,192,921 also teaches the use of a diode laser as the light source in place of the traditional discharge resonance lamp. Such diode lasers must be stabilized at the required wavelength. U.S. Pat. No. 5,442,326 discloses an arrangement for controlling the wavelength of the laser diode.

In developing an optimum miniature atomic frequency standard, other factors must be taken into consideration. An important factor is the power needed to operate the device. The heaters needed to stabilize the temperature of the vapor draw considerable power. There is a need therefore for designing the miniature atomic frequency standard to reduce the power requirements for maintaining the temperature of the vapor. There is an additional need for reducing the size of the optics needed to focus the light on the vapor and to gather the light for the photo detector. There is also a need to minimize the effects of the magnetic fields produced by the currents drawn by the heaters and the light source.

SUMMARY OF THE INVENTION

These needs and others are satisfied by the invention which is directed to a miniature atomic frequency standard in which, according to one aspect of the invention heater means are provided inside the magnetic shield for more efficient heating of the vapor. In one embodiment, the heater means directly heats the vapor cell. Preferably, the cell is in the form of a tubular member which extends transversely through the microwave cavity with the chamber containing the vapor contained within the cavity and ends of the tubular member extending outward from the cavity with electric heater means provided on the extensions. The entire assembly is enclosed within a magnetic shield which may be evacuated or filled with a thermal insulation material to reduce heat loss, and therefore the power required to maintain steady vapor temperature. Heat loss can also be reduced by enlarging the openings in the cavity through which the tubular member extends, although this must be balanced against the adverse effects it can have on microwave resonance of the cavity.

Alternatively, electric heater means are applied to the microwave cavity rather than the vapor cell itself, but again, inside the magnetic shield. In either case, these electric heaters are only energized at intervals when the microwave signal is not being tuned so that the magnetic fields generated by the currents in these heaters do not destabilize the microwave signal. Another feature for reducing heat loss where heat is only being applied to the vapor cell directly, or to the microwave cavity, is to move the C field coil outward from the microwave cavity toward the inner wall of the magnetic shield. Conveniently, this can be done by placing the C field winding on the thermal insulation which surrounds the microwave cavity.

In accordance with another aspect of the invention, the laser diode light source is placed outside the magnetic shield where it cannot influence the microwave signal, and the light beam is injected into one end of the tubular vapor cell by an optic fiber. The optic fiber is selected to have an angle of divergence which substantially fills the vapor chamber without the necessity of any collimating lens. In addition, the photo detector is in the form of a miniature photodiode which fits inside the other end of the tubular member. This miniature photodiode has an integral lens which focuses the light which has passed through the vapor onto the photo sensitive element of the detector.

The result of these features is a practical, compact, stable physics package which is on the order of 10 cm$^3$ in volume, and which has heater power requirements of only about 100 m/w.

BRIEF DESCRIPTION OF THE DRAWINGS

A full understanding of the invention can be gained from the following description of the preferred embodiments when read in conjunction with the accompanying drawings in which.

DESCRIPTION OF THE PREFERRED EMBODIMENT

The present invention is directed to a miniature atomic frequency standard of the type described in U.S. Pat. No. 5,192,921 which is hereby incorporated by reference. This patent describes the principles of producing an extremely compact atomic frequency standard and certain embodiments of such a frequency standard. The present invention is directed to preferred embodiments of such a miniature atomic frequency standard and particularly to the physics package (non-electronic) portion of such a miniature frequency standard.

Figure 1:
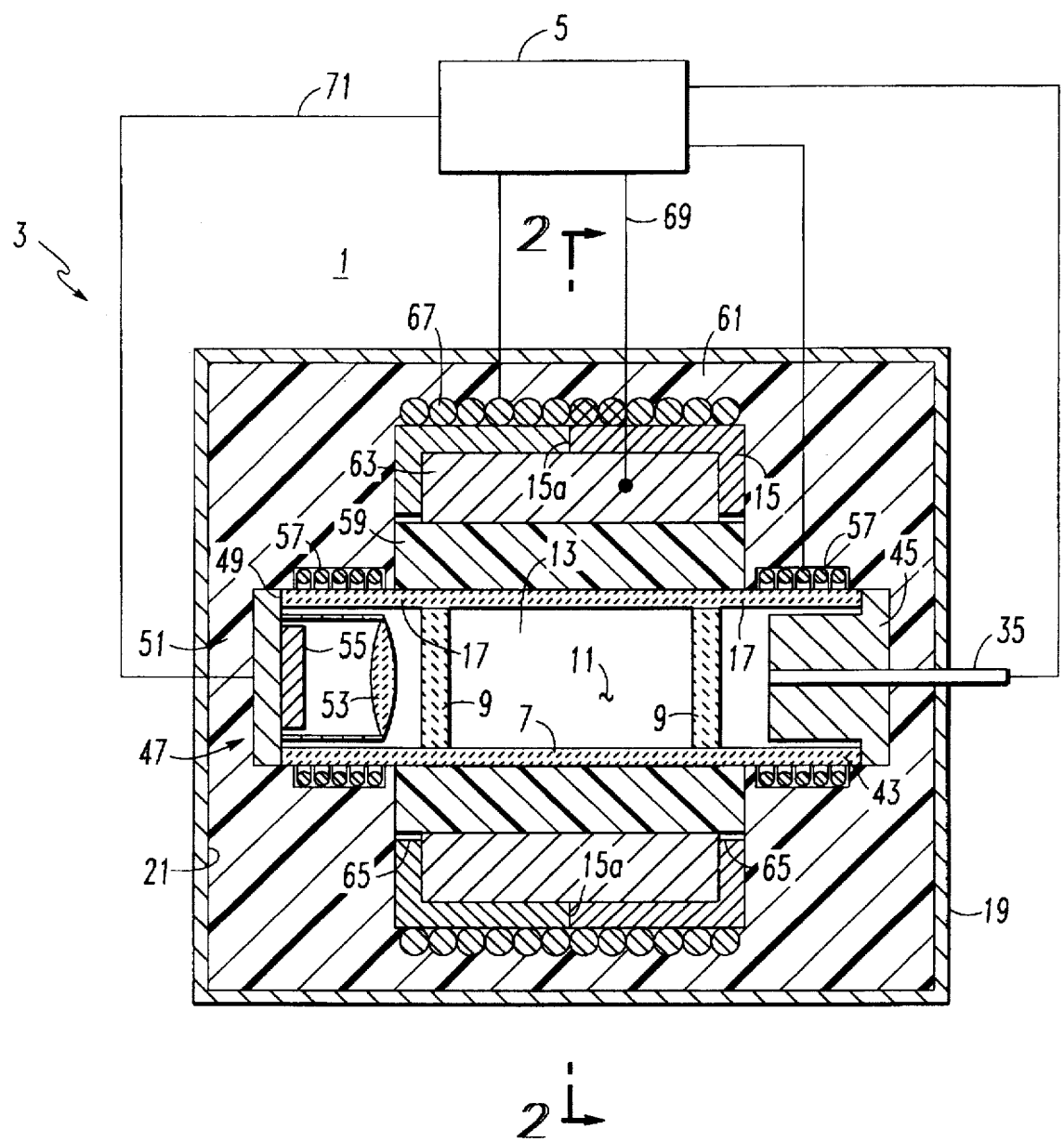
FIG. 1 is a longitudinal sectional view through an atomic frequency standard in accordance with a first embodiment of the invention.
Figure 2:
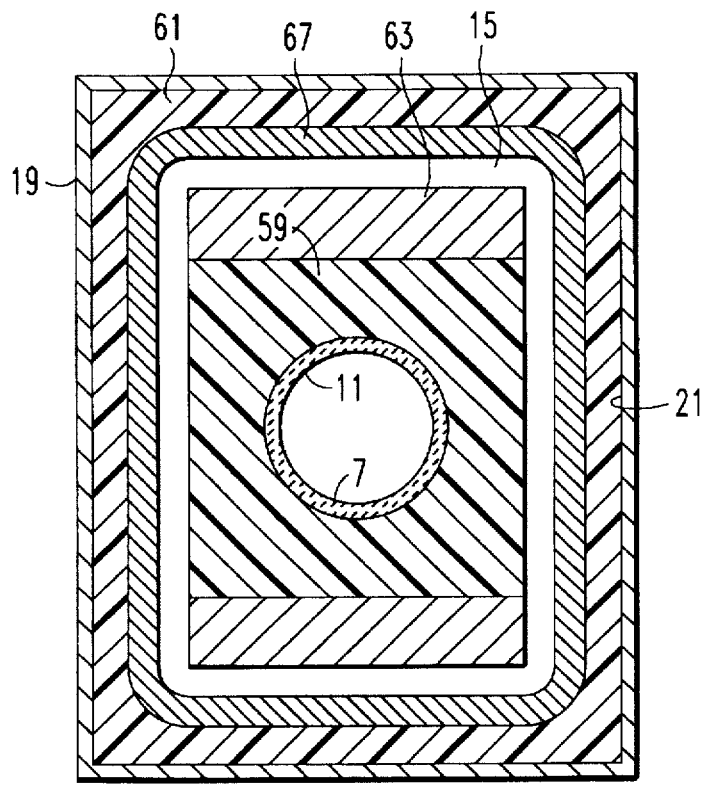
FIG. 2 is a cross sectional view taken along the line 2—2 through the atomic frequency shown in FIG. 1.

FIGS. 1 and 2 illustrate a first embodiment of an atomic frequency standard 1 in accordance with the invention. This atomic frequency standard 1 includes a physics package 3 and an electronics package 5. The heart of the physics package is a vapor cell. As discussed in U.S. Pat. No. 5,192,921 cesium or rubidium can be used as the vapor with cesium preferred because its microwave atomic transition frequency is of shorter wavelength than that of rubidium which permits the physics package to be made smaller. The vapor cell is formed by a tubular member 7 made for instance of a borosilicate glass such as Corning 774 or Corning 7070, and having a preferred diameter of about 6 mm. A pair of glass windows 9 spaced apart in the tubular member 7 form a chamber 11 for the cesium vapor 13. The tubular member 7 extends laterally through a microwave cavity 15 with extensions 17 extending outside of the microwave cavity. Preferably, the microwave cavity 15 is a $TE_{210}$ cavity which can be made in two halves with a parting line 15a in a plane perpendicular to the length of the tubular member 7.

Figure 3:
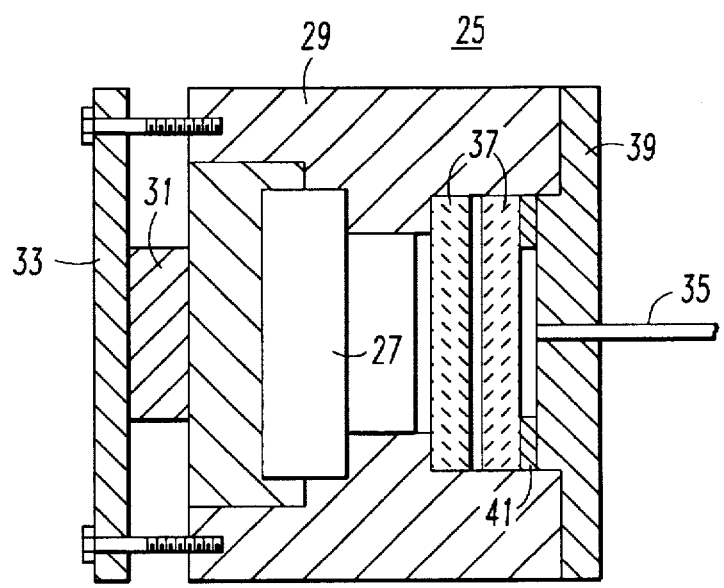
FIG. 3 is a longitudinal section through the laser assembly which forms part of the atomic frequency standard of the invention.

The microwave cavity 15 is enclosed within a magnetic shield 19 forming a space 21 into which the extensions 17 on the tubular member 7 extend. A light source 23 includes a laser diode assembly 25 (FIG. 3) which is external to the magnetic shield 19. As shown in FIG. 3, the laser diode assembly 25 includes a laser diode 27 mounted in a cylindrical thermally insulating support 29. A thermoelectric cooler/heater 31 is secured to the laser diode to maintain proper operating temperature of the laser diode. The thermal electric cooler/heater 31 has a heat sink 33 which is bolted to the cylindrical support 29. Light generated by the laser diode 27 is transmitted to the vapor cell 7 by an optical fiber 35. As the laser diode 27 generates more light than is required, neutral density glass filters 37 attenuate the light injected into the optical fiber 35. These filters 37 are secured in the support 29 by a clamp 39 and spacer 41.

The optical fiber 35 is secured in the extension 17 at a first end 43 of the tubular member 7 by a ferrule 45. The light transmitted by the optical fiber 35 passes through the vapor 13 and impinges upon a photodetector 47 inserted into the extension 17 at the second end 49 of the tubular member 7. Preferably the photodetector 47 is a photodiode 51 having an integral lens 53 which focuses light emerging from the vapor cell 11 onto the photo sensitive element 55 of the photodiode. The optical fiber 35 is selected to have an angle of divergence which substantially fills the lens 53 without the need for any collimating lens.

As mentioned, the cesium must be heated to maintain sufficient vapor pressure in the chamber 11 for stabilized operation of the atomic frequency standard. In accordance with the embodiment of the invention shown in FIGS. 1 and 2, the vapor chamber 11 is heated directly, preferably by electric heating tape 57 on the extensions 17 of the tubular member 7. This places the heaters adjacent the windows 9 which has the advantage of assuring that vapor does not condense on the windows. This arrangement applies the heat directly to the vapor cell and therefore has the potential for requiring the least power for heating. However, the microwave cavity 15 is a good thermal conductor which conducts heat away from the vapor cell. Therefore, thermal insulation 59 is provided on the tubular member 7 inside the microwave cavity 15. Additional thermal insulation 61 is provided in the space 21 between the microwave cavity 15 and the magnetic shield 19. A high dielectric material 63 is provided in the outer part of the microwave cavity 15 to reduce the physical size of the cavity as is well known. Even with the thermal insulation there is significant heat loss from the vapor cell through the microwave cavity 15. This heat loss can be reduced by enlarging the apertures 65 in the walls of the microwave cavity 15 through which the tubular member 7 extends. The size of these openings 65 is limited however because they disturb the microwave performance of the cavity. These openings reduce the coupling and allow microwaves to enter and/or leave the cavity. A C field winding 67 is provided on the microwave cavity 15 to stabilize the hyperfine wavelengths as is well known. In production, the thermal insulation 59 and dielectric 63 can be molded around the tubular member 7, and the microwave cavity 15 can then be deposited as a film on the outer surface of this molded package.

The electronics package 5 provides power for and controls the physics package 3. It includes a microwave oscillator which is locked to the microwave atomic transition frequency of the cesium and which generates the atomic frequency standard output frequency proportional to the hyperfine frequency, which is ~9.2 GHz for cesium. A microwave signal is provided to the physics package 3 for insertion into the magnetic cavity 15 by a coaxial cable 69. The electronics package 5 also includes circuitry responsive to the signal proportional to the light passing through the vapor cell which is generated by the photodiode 51 and transmitted to the electronics package 5 by lead 71. The electronics package 5 also includes circuitry controlling the laser diode 27, the C field coil 67 and the thermal electric cooler/heater 31. As the electric currents drawn by the heater coils 57 generate magnetic fields which can affect the microwave signal coupled to the cesium vapor, these heaters are only operated at time intervals when the microwave signal is not being tuned by the control circuitry of the electronics package. This typically amounts to about one-third of the time. Since the heaters are designed to operate about one-third of the time, they can be operated continuously during start-up, before the microwave signal is precisely tuned, to rapidly bring the vapor cell 7 up to operating temperature without drawing additional current or requiring auxiliary heaters.

Instead of filling the space 21 between the microwave cavity 15 and the magnetic shield 19 with the thermal insulation 61, this space can be evacuated for better insulation. The thermal insulation 61 within the microwave cavity 15 could also be replaced by a vacuum for better thermal insulation. In this case, thermal insulating supports would be needed to support the microwave cavity and the vapor cell within the magnetic shield 19.

Figure 4:
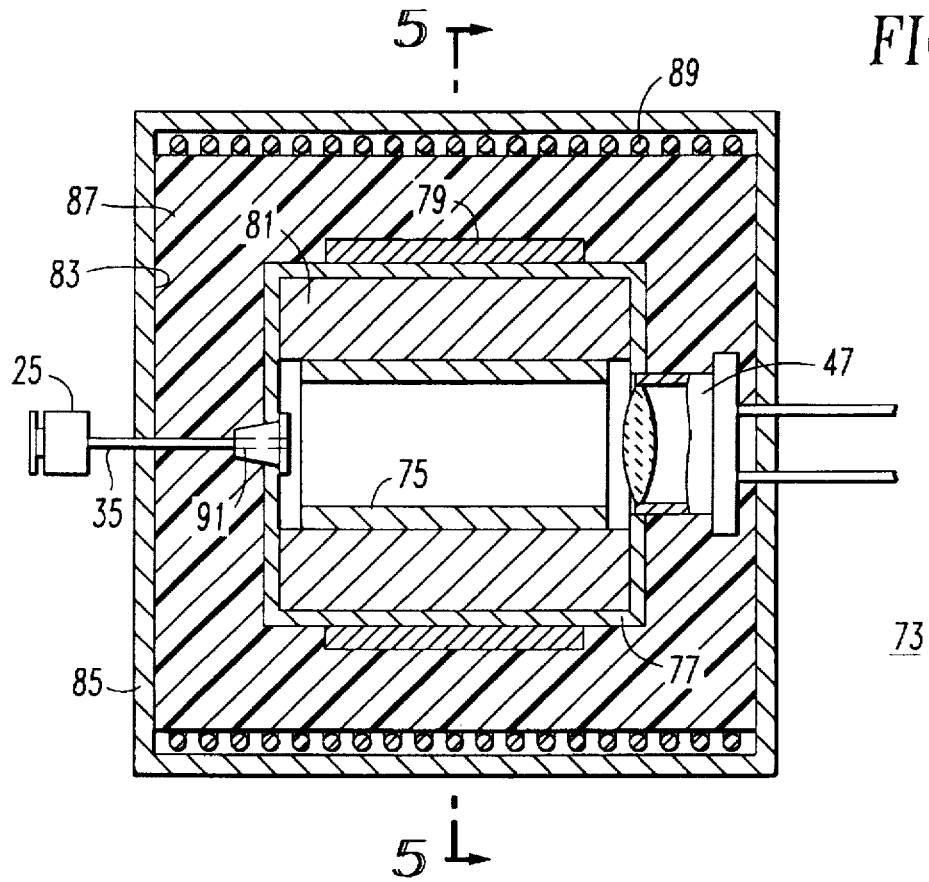
FIG. 4 is a longitudinal sectional view through a second embodiment of the invention.
Figure 5:
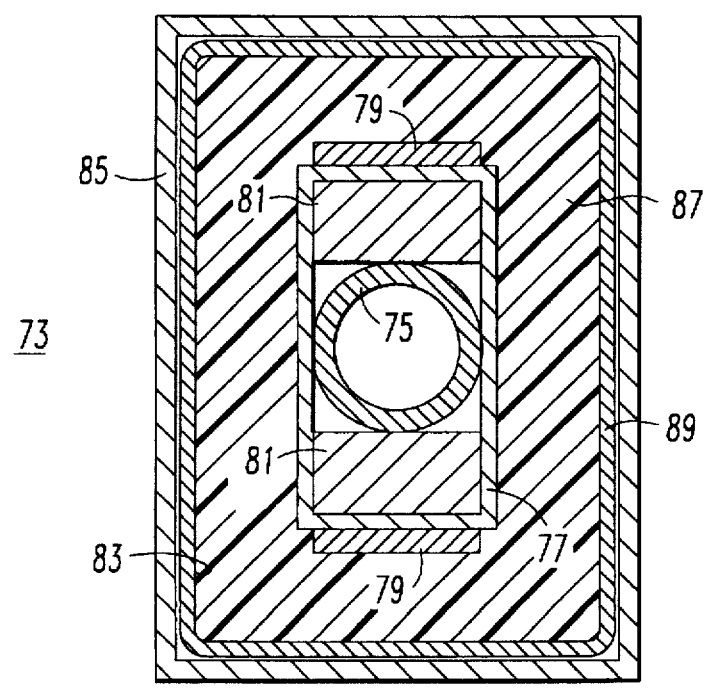
FIG. 5 is a cross-sectional view taken along the line 4—4 through the atomic frequency standard shown in FIG. 3.

A second embodiment of the invention is shown in FIGS. 4 and 5. In this embodiment, the microwave cavity is heated which heats the vapor cell within, rather than heating just the vapor cell directly. Thus, the physics package 73 includes the tubular vapor cell 75 mounted inside the microwave cavity 77. The heater 79 in the form of a heat conducting film is applied to the outside of the microwave cavity. In this instance, the thermal insulation inside the microwave cavity is eliminated in order to increase heat transfer between the heated microwave cavity and the tubular vapor cell 75. Thus, the microwave cavity 77 is smaller than in the embodiment shown in FIGS. 1 and 2. The microwave cavity is still filled with a dielectric 81; however, in order to enhance the microwave performance. The space 83 between the microwave cavity and the magnetic shield 85 is again filled with a thermal insulation 87. The thickness of this thermal insulation is such that the outer dimensions of the magnetic shield 85 are about the same as for the embodiment shown in FIGS. 1 and 2. As in the case of the first embodiment, the space 83 can be evacuated rather than filled with a thermal insulation 87. This would also require thermally insulating supports for the microwave cavity 77. In this embodiment, the C field coil 89 is wound on the outside of the thermal insulation 87 thereby placing it just inside the magnetic shield 85. This reduces heat loss by conduction through the C field coil.

The embodiment of the invention shown in FIGS. 4 and 5 also utilizes as a light source the laser diode assembly 25 external to the magnetic shield 85. Light from the laser diode of the light source is transmitted through the optic fiber 35. There is no extension on the tubular vapor cell 75 so that the optic fiber 35 is held against the end of the vapor cell by a plug 91 fixed in an aperture in the wall of the microwave cavity 77. Similarly, the photodetector 47 is secured directly in an opening in the opposite wall of the microwave cavity 77.

While specific embodiments of the invention have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of invention which is to be given the full breadth of the claims appended and any and all equivalents thereof.

What is claimed is:

1. A miniature atomic frequency standard comprising:
    a microwave cavity;
    a C-field winding located on said microwave cavity;
    a tubular member located in and extending transversely through said microwave cavity and including first and second ends extending beyond said microwave cavity but within a magnetic shield surrounding both said microwave cavity and said tubular member, said tubular member having a vapor chamber situated within said microwave cavity and containing a vapor with specified atomic transition frequencies/wavelengths including an optical resonance wavelength and a microwave atomic transition frequency;
    heater means directly applied to said first and second ends for heating said vapor;
    light beam generating means for injecting a beam of light at said optical resonance wavelength into said vapor in said chamber through said first end of said tubular member including an optic fiber having an angle of divergence which substantially fills the vapor chamber without the necessity of any collimating lens;
    photodetector means generating a detector signal in response to light from said light beam generating means which has passed through said vapor in said chamber to said second end of said tubular member; and
    control means responsive to said detector signal for controlling said light beam to said optical resonance wavelength and for applying a microwave signal locked to the microwave atomic transition frequency to said microwave cavity, said control means also generating a frequency standard signal at a frequency proportional to said microwave atomic transition frequency.

2. The miniature atomic frequency standard of claim 1 wherein:
    said magnetic shield is spaced from said microwave cavity to form a space into which said first and second ends of said tubular member extend, said space being evacuated to form a thermal barrier.

3. The miniature atomic frequency standard of claim 1 wherein:
    said microwave cavity contains a dielectric material.

4. The miniature atomic frequency standard of claim 1 wherein:
    said microwave cavity at least partially contains thermal insulation around said tubular member and said magnetic shield is spaced from said microwave cavity to form a space into which said first and second ends of said tubular member extend, said space containing additional thermal insulating material.

5. The miniature atomic frequency standard of claim 1 wherein:
    said microwave cavity has openings through which said first and second ends of said tubular member extend, said openings having edges spaced from said tubular member to reduce conductive heat loss from said tubular member through said microwave cavity.

6. The miniature atomic frequency standard of claim 1 wherein said tubular member has a pair of spaced apart windows forming said chamber, said electric heaters being positioned on said first and second ends of said tubular member adjacent said windows.

7. The miniature atomic frequency standard of claim 1 wherein:
    said light beam generating means comprises a laser diode positioned outside said magnetic shield and generating said beam of light at said optical resonance wavelength, and an optic fiber injecting said beam of light into said vapor in said chamber through said first end of said tubular member.

8. The miniature atomic frequency standard of claim 1 wherein said control means includes means responsive to said detector signal for turning said microwave signal on only during specified intervals and energizing said electric heater means only at times other than during said specified intervals.

9. A miniature atomic frequency standard comprising:

a microwave cavity;

a tubular member extending transversely across said microwave cavity and having a chamber within said microwave cavity, said chamber containing a vapor with specified atomic transition frequencies/wavelength including an optical resonance wavelength and a microwave atomic transition frequency;

heater means for heating the vapor in said chamber and being located on an outer surface of said microwave cavity;

magnetic shield means surrounding said microwave cavity and tubular member;

a C-field winding located within said magnetic shield means and being spaced away from said microwave cavity;

light beam generating means comprising a laser diode unit external to said magnetic shield means and generating a beam of light at said optical resonance wavelength, and an optic fiber extending from said laser diode unit through said magnetic shield means and microwave cavity and to a first end of said tubular member for injecting said beam of light at said optical resonance wavelength into said vapor in said chamber said optic fiber having and angle of divergence which substantially fills the vapor chamber without the necessity of any collimating lens;

photodetector means generating a detector signal in response to said light beam at a second end of said tubular member after the light beam has passed through said vapor; and control means responsive to said detector signal for controlling said light beam to said optical resonance wavelength and for applying a microwave signal locked to the microwave atomic transition frequency to said microwave cavity, said control means also generating a frequency standard signal at a frequency proportional to said microwave atomic transition frequency.

10. The miniature atomic frequency standard of claim 9 including thermal insulating material between said microwave cavity and said magnetic shield.

11. The miniature atomic frequency standard of claim 9 wherein said photodetector means comprises a photodiode unit positioned adjacent said second end of said tubular member, said photodiode unit comprising a light sensitive element and an integral lens focusing light which has passed through said vapor into said light sensitive element.

12. The miniature atomic frequency standard of claim 11 wherein said photodiode unit is supported by said microwave cavity adjacent said second end of said tubular member.

13. The miniature atomic frequency standard of claim 11 wherein said optic fiber has a diameter selected to inject said beam of light directly into said chamber with an angle of divergence which fills said chamber at least adjacent said photodiode unit.

14. The miniature atomic frequency standard of claim 13 wherein said optic fiber is supported by said microwave cavity adjacent said first end of said tubular member.

15. The miniature atomic frequency standard of claim 9 wherein said control means comprises means responsive to said detector signal for adjusting said microwave signal during specified intervals and energizing said heater means only at times other than said specified intervals.

16. The miniature atomic frequency standard of claim 9 wherein said magnetic shield means is spaced from said microwave cavity to form a space which is evacuated.

17. The miniature atomic frequency standard of claim 9 wherein said magnetic shield means is spaced from said microwave cavity to form a space which is filled with a thermal insulating material.

18. The miniature atomic frequency standard of claim 9 wherein a space is formed between said microwave cavity and said tubular member and wherein said space contains a dielectric material.

19. The miniature atomic frequency standard of claim 18 wherein said space is filled with said dielectric material.

* * * * *